United States Patent
Stanton et al.

(10) Patent No.: US 6,524,751 B1
(45) Date of Patent: Feb. 25, 2003

(54) RETICLE DESIGN FOR ALTERNATING PHASE SHIFT MASK

(75) Inventors: William A. Stanton, Boise, ID (US); Vishnu K. Agarwal, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/519,357

(22) Filed: Mar. 6, 2000

(51) Int. Cl.[7] .............................. G03F 9/00; G03C 5/00
(52) U.S. Cl. ...................... 430/5; 430/322; 430/323; 430/324
(58) Field of Search ........................... 430/5, 322, 323, 430/324

(56) References Cited

U.S. PATENT DOCUMENTS

| | | | |
|---|---|---|---|
| 5,715,039 A | 2/1998 | Fukuda et al. | 355/53 |
| 5,858,580 A | 1/1999 | Wang et al. | 430/5 |
| 5,882,824 A * | 3/1999 | Kim | 430/5 |
| 6,010,807 A * | 4/2000 | Lin | 430/5 |

* cited by examiner

*Primary Examiner*—Christopher G. Young
*Assistant Examiner*—Saleha R. Mohamedulla
(74) *Attorney, Agent, or Firm*—Dickstein Shapiro Morin & Oshinsky LLP

(57) ABSTRACT

The present invention provides a method and apparatus for producing 0 degree light and 180 degree phase shifted light having substantially equal intensities as both lights exit an alternating phase shift reticle. A material is inserted within the etched portion of the 180 degree phase shift channel of a reticle, wherein the material contains an index of refraction such that the first order light (+1, −1) is propagated through the 180 degree channel. The end result is a 180 degree phase shifted light having an intensity substantially equal to that of the 0 degree light.

15 Claims, 6 Drawing Sheets

RETICLE DESIGN FOR ALTERNATING PHASE SHIFT MASK

BACKGROUND OF THE INVENTION

1. Field of the Invention

The present invention relates to the field of semiconductor manufacturing. More specifically, it relates to an improved reticle design for ensuring that both the 0 degree light and the 180 degree light passing through an alternating phase shift mask are of approximately equal amplitude.

2. Description of the Related Art

Lithography processing is a required technology when manufacturing conventional integrated circuits (IC's). Many different lithography techniques exist and all lithography techniques are used for the purpose of defining geometries, features, lines or shapes onto an IC die or wafer. In general, a radiation sensitive material, such as photoresist, is coated over a top surface of a die or wafer and is patterned using lithography techniques to selectively permit the formation of the desired geometries, features, lines, or shapes.

One known method of lithography is optical lithography. The typical optical lithography process generally begins with the formation of a photoresist layer on the top surface of a semiconductor wafer. A mask typically of quartz and having fully light non-transmissive opaque regions, which are usually formed of chrome, and fully light transmissive clear regions (non-chromed) is then positioned over the aforementioned photoresist coated wafer. Light is directed onto the mask via a visible light source or an ultra-violet light source. This light passes through the clear regions of the mask and exposes the underlying photoresist layer, and is blocked by the opaque regions of the mask, leaving that underlying portion of the photoresist layer unexposed. The exposed photoresist layer is then developed, typically through chemical removal of the exposed/non-exposed (depending on whether the photoresist is positive or negative photoresist) regions of the photoresist layer. The end result is a semiconductor wafer coated with a photoresist layer exhibiting a desired pattern. This pattern can then be used for etching underlying regions of the wafer.

In recent years, there has been great demand to increase the number of transistors on a given wafer area. Meeting this demand has meant that IC designers have had to design circuits with smaller minimum dimensions. However, it was found that the traditional optical lithography process placed real limits on the minimum realizable dimension due to diffraction effects. That is, light shining onto the mask is modified as it passes through the mask and therefore the desired photoresist pattern differed somewhat from the pattern actually achieved. In particular, as the minimum dimension approaches 0.1 microns, traditional optical lithography techniques will not work very effectively.

One technique that has been used to realize smaller minimum device dimensions is called phase shifting. In phase shifting, the destructive interference caused by two adjacent clear areas in an optical lithography mask is used to create an unexposed area on the photoresist layer. This is accomplished by making use of the fact that light passing through the clear regions of a mask exhibits a wave characteristic such that the phase of the amplitude of the light exiting from the mask material is a function of the distance the light travels in the mask material. This distance is equal to the thickness of the mask material. By placing two clear areas adjacent to each of other on a mask, one of thickness t1 and the other of thickness t2, one can obtain a desired unexposed area on the photoresist layer through interference. By making the thickness t2 such that (n−1)(t2) is exactly equal to ½ λ, where λ is the wavelength of the exposure light, and n is the refractive index of the material of thickness t1, the amplitude of the light exiting the material of thickness t2 will be 180 degrees out of phase with the light exiting the material of thickness t1.

Since the photoresist material is responsive to the intensity of the light, and the opposite phases of light cancel where they overlap, a dark unexposed area will be formed on the photoresist layer at the point where the two clear regions of differing thicknesses are adjacent. Phase shifting masks are well known and have been employed with various configurations. The configuration described above is known as an alternating phase shift mask (APSM). APSMs have been shown to achieve dimension resolution of 0.25 microns and below.

Referring to FIG. 1, a standard reticle design 100 for an alternating phase shift mask is depicted. The reticle contains a light transmissive region 104 (e.g., quartz) and light non-transmissive regions 102 (e.g., chrome). The reticle 100 also contains a 0 degree channel 116 and a 180 degree phase shift channel 114. As described above, the 180 degree phase shift channel 114 is created by forming an etched portion 112 in the light transmissive region 104 such that the distance traveled within the reticle 100 is shorter for light rays 106 than for light rays 108, where the light rays 106, 108 are provided by illumination source 110.

As described above in connection with alternating phase shift masks, the difference in the distance traveled by light rays 106, 106 through light transmissive region 104 in combination with the refractive index of the light transmissive region 104 and the wavelength of the light rays 106, 108 are calculated such that the amplitude of the light rays 106 exiting the reticle 100 are 180 degrees out of phase with the light rays 108 exiting the reticle 100.

While APSMs have been used with a great degree of success, they still have some drawbacks. For instance, currently, the amplitude of the 0 degree and the 180 degree phase shifted intensities exiting an alternating phase shift mask are not equal. For example, FIG. 2 depicts image intensity for both 0 degree light and 180 degree phase shifted light. It is clear from the graphical representation that the intensity of the 180 degree phase shifted light is substantially less (e.g., approximately 19% less) than the 0 degree light. The reason for this discrepancy is that the first order of diffracted light (designated +1 and −1) traveling through the 180 degree phase shift channel 114 does not completely pass through the reticle 100 because it is prevented from doing so by the light non-transmissive regions 102 (e.g., the chrome regions). Since the intensities of the 0 degree and 180 degree phase shifted light rays are not equal, the above-described process of canceling out opposite polarities of light is not optimized. As a result, the unexposed areas of the photoresist where the two light rays overlap are poorly defined, thereby inhibiting optimal IC designs. Thus, a method and apparatus for producing 0 degree light and 180 degree phase shifted light having substantially equal intensities as that light exits an alternating phase shifted mask is desirable.

SUMMARY OF THE INVENTION

The present invention provides a method and apparatus for producing 0 degree light and 180 degree phase shifted light having substantially equal intensities as that light exits an alternating phase shifted mask. In the present invention, a material is inserted within the etched portion 112 of the 180 degree phase shift channel 114 of a reticle 100, wherein the material contains an index of refraction such that the first order light (+1, −1) is propagated through the 180 degree channel 114. The end result is a 180 degree phase shifted light having an intensity substantially equal to that of the 0 degree light.

BRIEF DESCRIPTION OF THE DRAWINGS

These and other advantages and features of the invention will be more clearly understood from the following detailed description of the invention which is provided in connection with the accompanying drawings in which.

DETAILED DESCRIPTION OF PREFERRED EMBODIMENTS

Preferred embodiments of the present invention will now be described with reference to FIGS. 3–6. Other embodiments may be realized and structural, or logical changes may be made to the disclosed embodiments without departing from the spirit or scope of the present invention.

Figure 1:
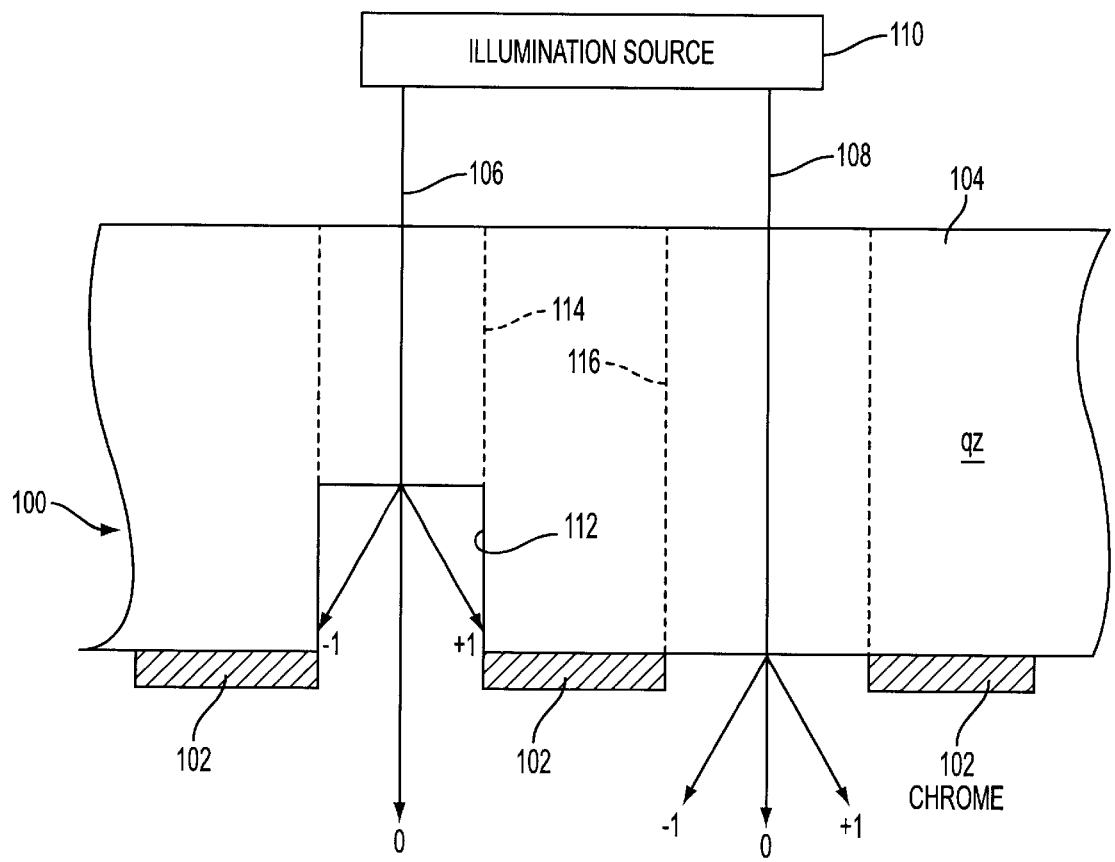
FIG. 1 illustrates a standard reticle design for an alternating phase shift mask.
Figure 2:
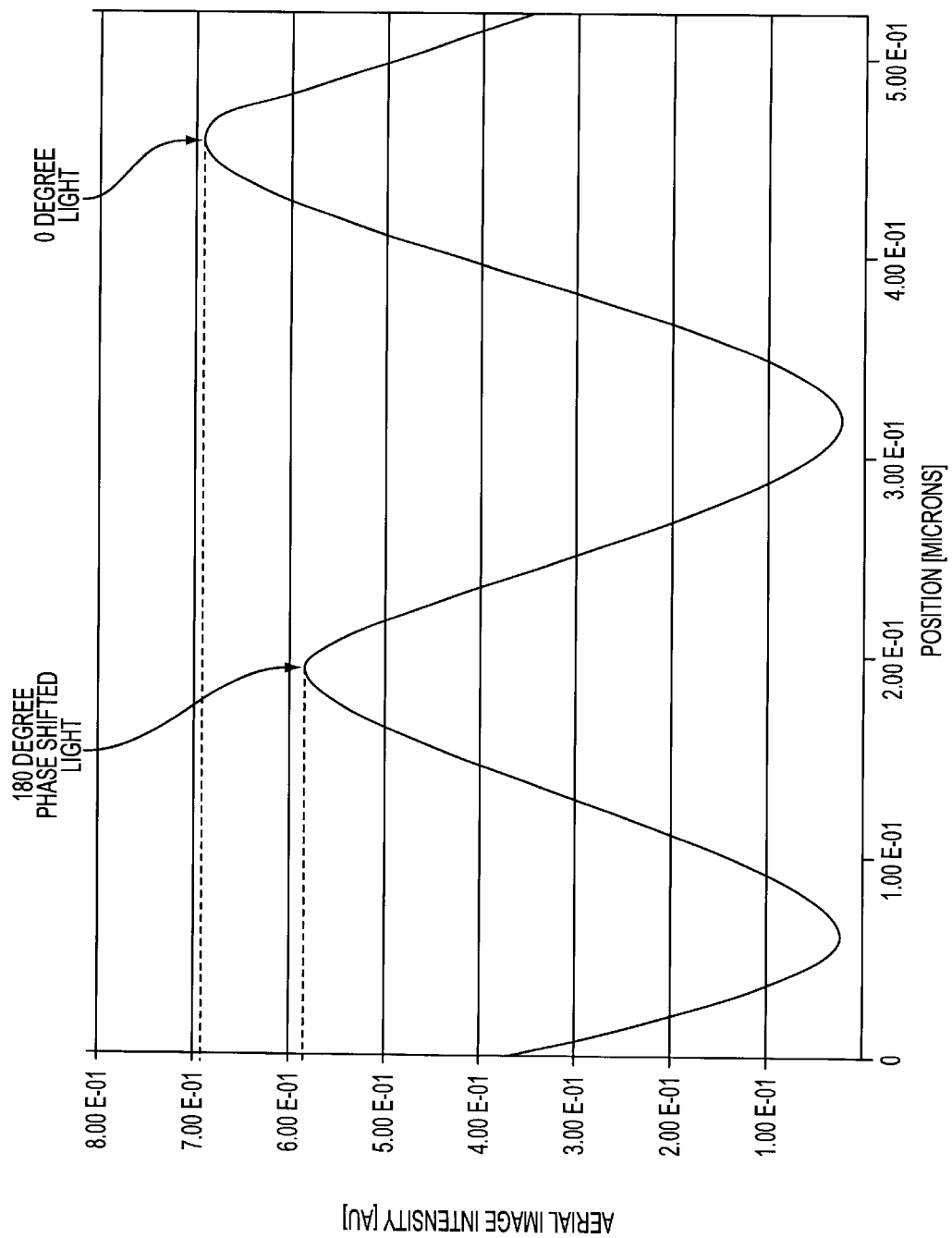
FIG. 2 illustrates a graphical representation of respective image intensities for 0 degree light and 180 degree phase shifted light exiting the FIG. 1 reticle.
Figure 3:
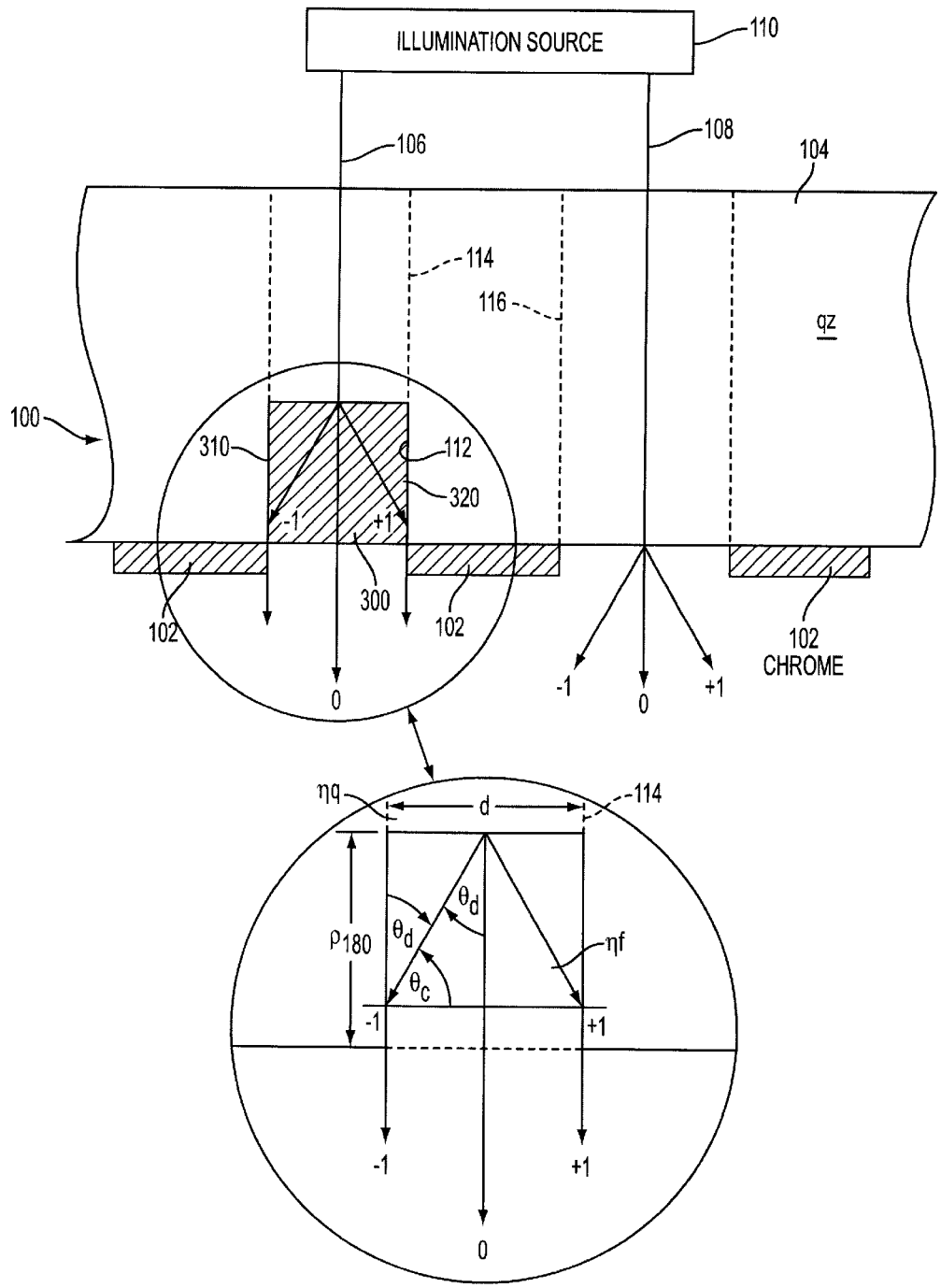
FIG. 3 illustrates a reticle design for an alternating phase shift mask in accordance with a first embodiment of the invention.

FIG. 3 illustrates a reticle design for an alternating phase shift mask in accordance with a first embodiment of the invention. The FIG. 3 reticle is substantially the same as the FIG. 1 reticle except that the etched portion 112 of the 180 degree channel 114 is filled with a material 300 having a depth and an index of refraction such that the critical angle θc is reached (as will be described below) and the first order light (+1, −1) is fully propagated through the 180 degree channel 114.

The critical angle θc is the angle at which there is a state of total internal reflection. That is, when light rays (e.g., 106, 108) pass from a first medium (e.g., quartz 104) to a second medium (e.g., air within etched portion 112) where the second medium is less optically dense, as the angle of incidence of the light rays is increased, eventually, a critical angle of incidence is reached. At this critical angle, there is no longer a refracted light ray entering the second medium. That is, at the critical angle, there is a refracted light ray that runs parallel with the plane separating the two media. For angles of incidence greater than the critical angle, there exists total internal reflection (i.e., internal to the first medium), whereby no light travels from the first medium to the second medium. With this background, the depth of the etched portion 112 of the 180 degree channel 114 (i.e., $\rho_{180}$) and the index of refraction of the filling material $\eta_f$ can be calculated such that the critical angle θc is reached and the first order of the 180 degree phase shifted light (+1 −1) is deflected off of the planes 310, 320 separating the first medium i.e. material 300 and light transmissive region 104 (e.g., quartz).

Still referring to FIG. 3, it is known that:

1) The depth of the 180 degree phase etched portion $\rho_{180}$ $$\rho_{180} = \frac{\lambda_o}{2(\eta_q - \eta_f)};$$

2) d sin θ=mλ; where d=width of 180 degree channel, m=1 and θ is the angle of diffraction of first order light (+1, −1); and 3) Sin θc $$\sin\theta c = \frac{\eta_f}{\eta_q};$$

where $\eta_f > \eta_q$ for total internal reflection (as described above).

In addition, it is known that:

$$\theta c = \frac{\pi}{2} - \theta d;$$

$$\theta c = a\sin\left(\frac{\eta_q}{\eta_f}\right);$$

$$\theta d = a\sin\left(\frac{m\lambda}{d}\right); \text{ and}$$

$$\eta_f = \frac{\eta_q}{\sin\left[\frac{\pi}{2} - a\sin\left(\frac{m\lambda}{d}\right)\right]}.$$

Therefore, $$\rho_{180} = \frac{\lambda}{2\eta_q - \frac{\eta_q}{\sin\pi/2 - a\sin\frac{m\lambda}{d}}}$$

For example, if $\eta_q$=1.5326, λ=0.248 μm, d=0.520 μm, it is calculated that $\eta_f$ should be 1.7436 and $\rho_{180}$ should be 0.5875 μm in order for first order light (+1, −1) to pass through the 180 degree phase shifted channel 114.

Figure 4:
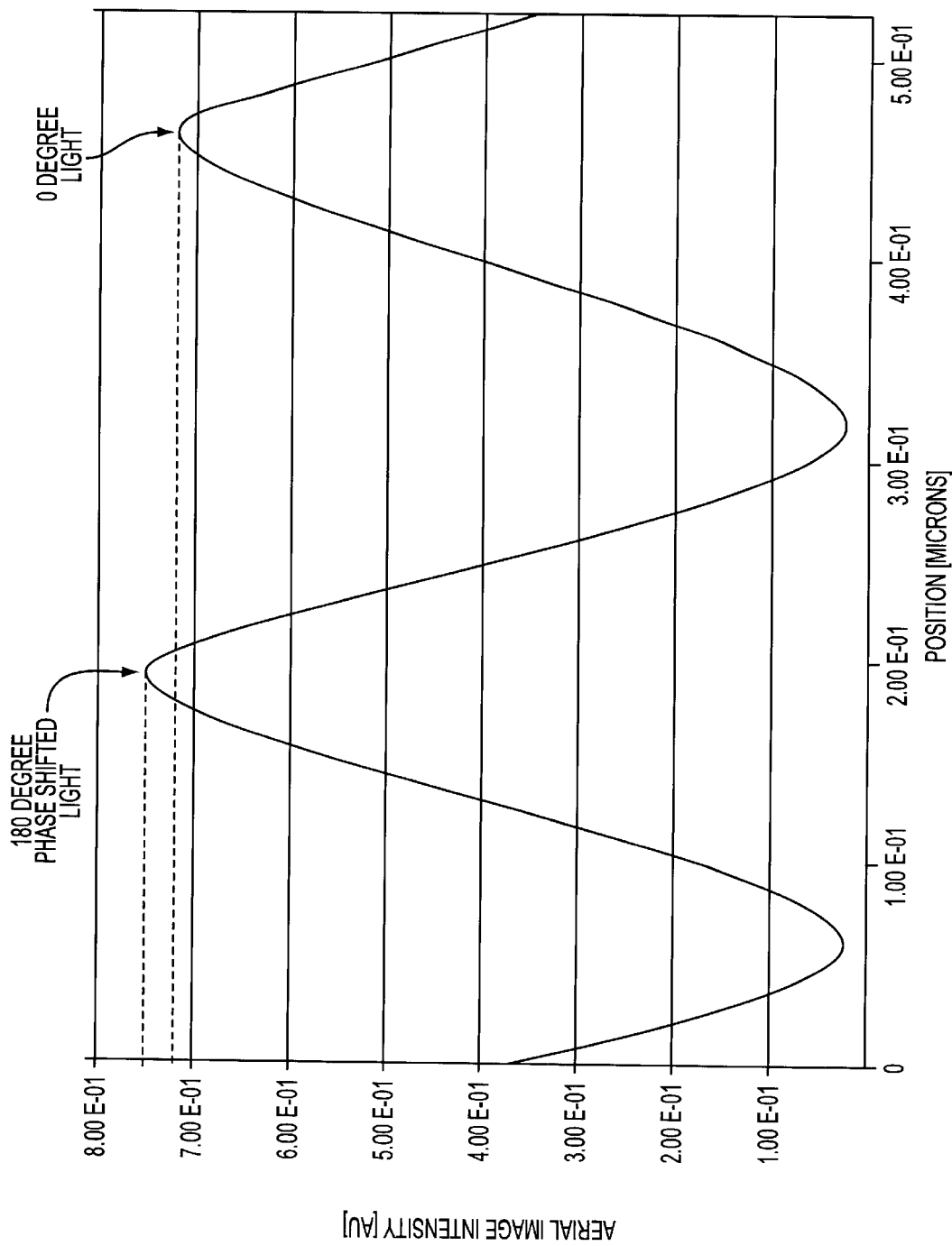
FIG. 4 illustrates a graphical representation of respective image intensities for 0 degree light and 180 degree phase shifted light exiting the FIG. 3 reticle.

Turning now to FIG. 4, a graphical representation of image intensities for both the 0 degree light and 180 degree phase shifted light exiting the FIG. 3 reticle is depicted. As shown, the intensity of the 180 degree phase shifted light is substantially equal to the intensity of the 0 degree light (about a 5% difference).

Figure 5:
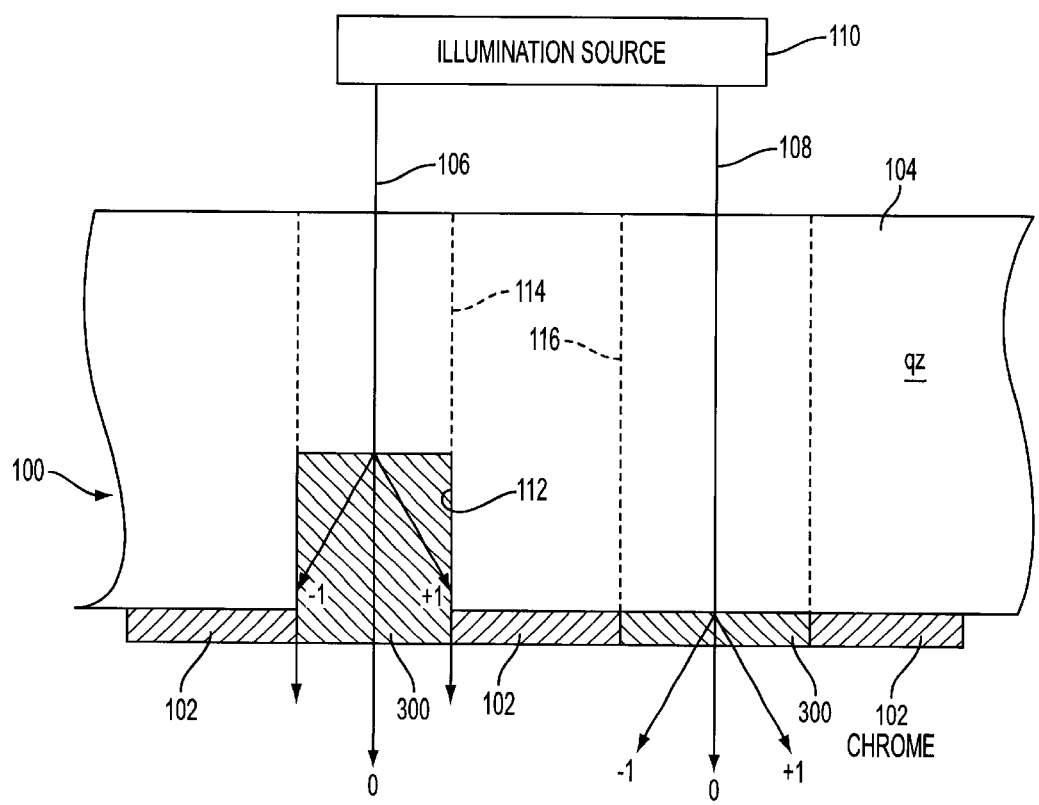
FIG. 5 illustrates a reticle design for an alternating phase shift mask in accordance with a second embodiment of the invention.

Turning now to FIG. 5, a reticle design for an alternating phase shift mask is depicted, in accordance with a second embodiment of the invention. The FIG. 5 reticle is substantially the same as the FIG. 3 reticle except that in addition to the etched portion 112 of the 180 degree channel 114 being filled with material 300, the portion of 180 degree channel 114 that extends up to the edge of light non-transmissive region 102 is also filled with material 300. In addition, that portion of 0 degree channel 116 that extends up to the edge of light non-transmissive region 102 is filled with material 300. The performance of this embodiment is substantially the same as the performance of the FIG. 3 embodiment.

Figure 6:
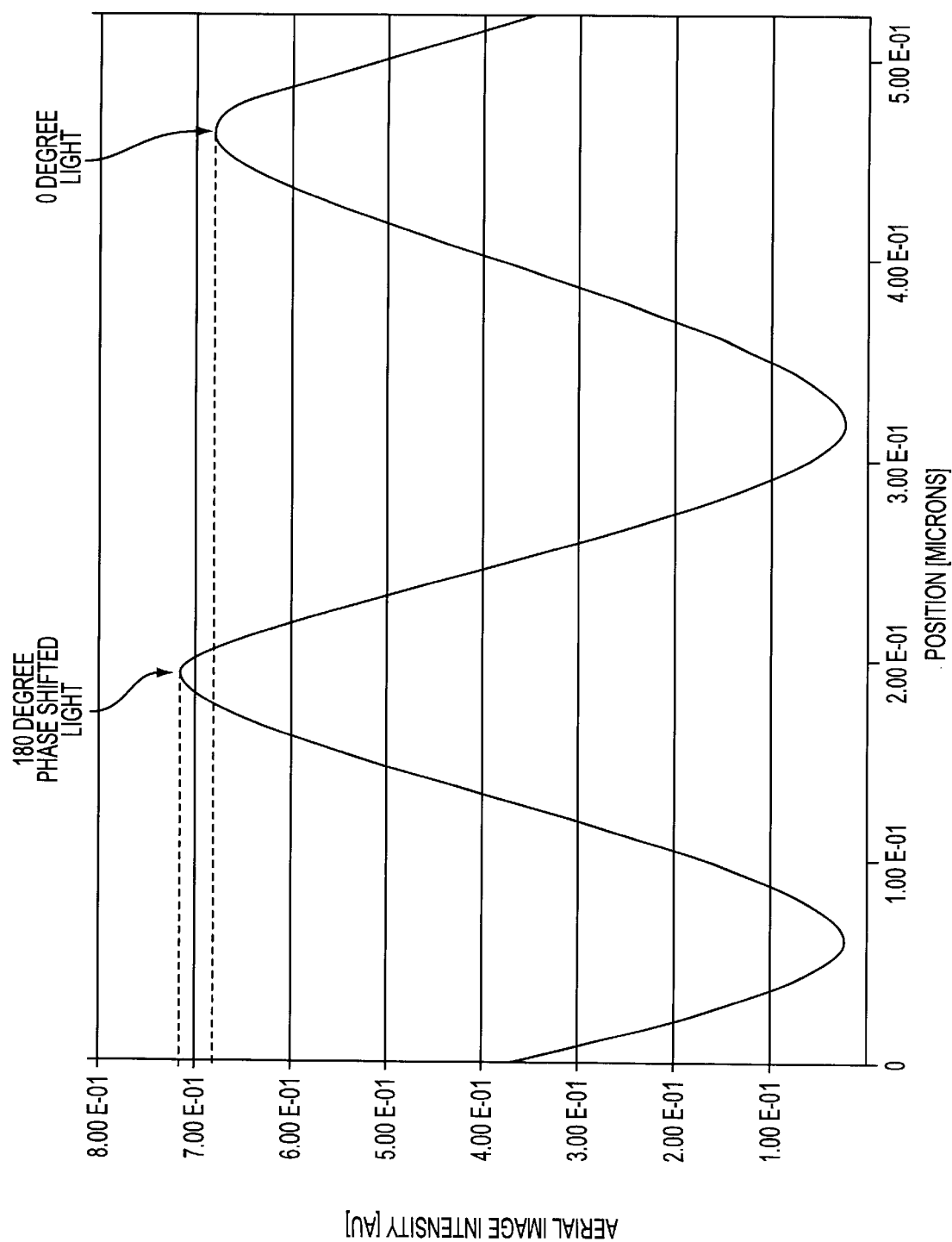
FIG. 6 illustrates a graphical representation of respective image intensities for 0 degree light and 180 degree phase shifted light exiting the FIG. 5 reticle.

Turning now to FIG. 6, a graphical representation of both the 0 degree light and 180 degree phase shifted light exiting the FIG. 5 reticle is depicted. As shown, the intensity of the 180 degree phase shifted light is substantially equal to the intensity of the 0 degree light (about a 4% difference).

While preferred embodiments of the invention have been described and illustrated, it should be apparent that many modifications can be made to the invention without departing from its spirit or scope. For example, although the invention has been described with reference to quartz and chrome, respectively, for the light transmissive and light non-transmissive regions, any material having similar properties may be substituted. Accordingly, the invention is not limited by the foregoing description or drawings, but is only limited by the scope of the appended claims.

What is claimed as new and desired to be protected by Letters Patent of the United States is:

1. An alternating phase shift reticle, comprising:
   a substrate having a 0 degree light path and an etched 180 degree phase shifted light path therein; and
   a material provided in at least one of said 0 degree and said etched 180 degree paths which causes an intensity of light exiting said etched 180 degree light path to be approximately equal to an intensity of light exiting said 0 degree light path, said material being separate from either of said 0 degree and said etched 180 degree light paths.

2. The reticle of claim 1, wherein said substrate is quartz.

3. The reticle of claim 1, wherein said material is provided in said 180 degree light path.

4. The reticle of claim 1, wherein said material is provided in both said 0 degree and said 180 degree light paths.

5. The reticle of claim 1, wherein said material contains a predetermined index of refraction and a predetermined depth.

6. The reticle of claim 5, wherein said material is adapted to transmit light rays from said etched portion of said 180 degree light path to a light exiting portion of said 180 degree light path.

7. The reticle of claim 6, wherein said material is adapted to direct light rays entering said etched portion at a predetermined angle such that said light rays exit said 180 degree light path.

8. The reticle of claim 7, wherein said material is configured to direct said light rays toward a sidewall of said etched portion such that a critical angle is formed, thereby redirecting said light rays in a direction parallel with said sidewall.

9. An alternating phase shift reticle, comprising:
   at least one 0 degree optical channel adapted to transmit a first set of light rays of a first intensity; and
   at least one etched 180 degree optical channel adapted to transmit a second set of light rays, said second set of light rays having a second intensity, wherein
   said at least one etched 180 degree channel is at least partially filled with a material having a depth and an index of refraction such that said first and second intensities are approximately equal, said material being separate from either of said 0 degree and etched 180 degree channels.

10. The alternating phase shift reticle of claim 9, wherein said at least one 0 degree optical channel is at least partially filled with said material.

11. A method of forming an alternating phase shift reticle, the method comprising:
    providing a substrate having a 0 degree and an etched 180 degree phase shifted light path; and
    providing a material in at least one of said 0 degree and said etched 180 degree paths which causes an intensity of light exiting said etched 180 degree light path to be approximately equal to an intensity of light exiting said 0 degree light path, said material being separate from either of said 0 degree and said etched 180 degree light paths.

12. The method as in claim 11, wherein said act of providing a substrate comprises providing a quartz substrate.

13. The method as in claim 11, wherein said act of providing a material comprises providing a filling material having a predetermined index of refraction and a predetermined depth within an etched portion of said 180 degree phase shifted light path.

14. An alternating phase shift reticle, comprising:
    a substrate having a 0 degree light path with a first length;
    a 180 degree phase shifted light path etched in said substrate with a second length shorter than said first length;
    a material provided in an etched portion of said 180 degree phase shifted light path that extends said second length to be approximately equal to said first length; and wherein
    said material causes an intensity of light exiting said 0 degree and 180 degree light paths to be substantially equal.

15. The reticle of claim 14 further comprising:
    a light non-transmissive region of said substrate adjacent to both said 0 degree and said 180 degree light paths, said light non-transmissive region extending to a third length beyond said first length, wherein
    said material provided in said etched portion of said 180 degree phase shifted light path extends approximately to said third length; and wherein
    said material is provided at an end of said 0 degree light path and extending approximately to said third length.

* * * * *